United States Patent [19]
Matsumoto et al.

[11] Patent Number: 5,701,019
[45] Date of Patent: Dec. 23, 1997

[54] SEMICONDUCTOR DEVICE HAVING FIRST AND SECOND STACKED SEMICONDUCTOR LAYERS, WITH ELECTRICAL CONTACT TO THE FIRST SEMICONDUCTOR LAYER

[75] Inventors: Hidetoshi Matsumoto, Kodaira; Masamitsu Yazawa, Yokohama; Kenji Hiruma, Tokorozawa, all of Japan

[73] Assignee: Hitachi, Ltd., Tokyo, Japan

[21] Appl. No.: 517,125

[22] Filed: Aug. 21, 1995

Related U.S. Application Data

[63] Continuation of Ser. No. 206,923, Mar. 7, 1994, abandoned.

[30] Foreign Application Priority Data

Mar. 12, 1993 [JP] Japan .................. 5-51664

[51] Int. Cl.$^6$ .................. H01L 31/0328; H01L 31/336; H01L 31/072; H01L 31/109
[52] U.S. Cl. .................. 257/192; 257/194
[58] Field of Search .................. 257/192, 194, 257/388, 376

[56] References Cited

U.S. PATENT DOCUMENTS 4,727,403  2/1988  Hida et al. .................. 257/194
4,788,156  11/1988  Stoneham et al. .................. 257/194

*Primary Examiner*—Stephen Meier
*Attorney, Agent, or Firm*—Antonelli, Terry, Stout & Kraus, LLP

[57] ABSTRACT

A semiconductor device (e.g., hetero-junction field-effect transistor) which has decreased capacitance between the gate and drain, and which has decreased source resistance, is provided. Structure in which a contact layer 6 comes in contact with the side surfaces of a channel layer 3 but does not come in contact with the side surfaces of a barrier layer 4 enables capacitance between the gate and drain to be decreased. This capacitance can be decreased down to 1.5 pF per 10 μm of the width.

48 Claims, 7 Drawing Sheets

SEMICONDUCTOR DEVICE HAVING FIRST AND SECOND STACKED SEMICONDUCTOR LAYERS, WITH ELECTRICAL CONTACT TO THE FIRST SEMICONDUCTOR LAYER

This application is a continuation of application Ser. No. 08/206,923, filed on Mar. 7, 1994, now abandoned.

BACKGROUND OF THE INVENTION

The present invention relates to a semiconductor device and to a method of fabricating the same. More specifically, the invention relates to contacts to sources and drains of field-effect transistors, in particular, of hetero-junction field-effect transistors that use III–V compound semiconductor. materials.

Performance of a field-effect transistor (FET) can be enhanced by decreasing the capacitance Cgd between the gate and drain, and by decreasing the source resistance Rs, in addition to decreasing the gate length Lg.

To decrease Rs, it is necessary to decrease the resistance of a contact layer which is formed between a channel layer and a source electrode. In this case, attention must be given to dopant distribution in the contact layer. When the contact layer is formed by the well-known ion implantation technology, the dopant is distributed describing a mild slope. Therefore, if it is attempted to decrease the resistance of the contact layer by increasing the energy of implantation or by increasing the dosage of implantation, then there arises the problem of a so-called short-channel effect. That is, the FETs having a short Lg exhibit a threshold voltage that varies to a great degree in different ones of the same type of device. This is because the slope in the distribution of dopant in the contact layer spreads up to the channel layer under the gate, to change the density of dopant in the channel layer.

In order to decrease resistance of the contact layer without developing the short-channel effect, therefore, it is necessary to use a contact layer in which the distribution of dopant describes a sharp slope. Technology for selectively growing a semiconductor layer of a high impurity concentration by the MOCVD (metal-organic chemical vapor deposition) method or the MOMBE (metal-organic molecular beam epitaxy) method has been studied in an attempt to form a contact layer in which the dopant distribution describes a sharp slope.

FIG. 2 illustrates a conventional field-effect transistor having a contact layer that is selectively grown. This is an example of application to a AlGaAs/GaAs hetero-junction FET. An n-type GaAs of a high concentration having a donor density of $3 \times 10^{18}/\text{cm}^3$, which is selectively grown by the MOCVD method, is used as a contact layer 6 that is brought into direct contact with an n-type GaAs channel layer 3 without interposing an undoped AlGaAs barrier layer 4 therebetween. This permits Rs to be decreased to smaller than 17 mΩ·cm. The short-channel effect is suppressed until Lg becomes smaller than 0.2 μm.

SUMMARY OF THE INVENTION

Though the above-mentioned prior art makes it possible to decrease Rs, an FET having higher performance can be realized if Cgd is also decreased.

A first object of the present invention is to provide an electrical contact for a semiconductor device, which permits Cgd as well as Rs to be decreased, and a method of fabricating the same.

A further object of the present invention is to provide a semiconductor device which permits Cgd as well as Rs to be decreased, and to provide a method of fabricating the same.

A further object of the present invention is to provide a field effect transistor having decreased source resistance, and also having a decreased capacitance between the gate and drain, and a method of manufacturing the same.

A still further object of the present invention is to provide a hetero-junction field effect transistor, formed of, e.g., III–V semiconductor material, and having a decreased capacitance between the gate and drain while having decreased source resistance, and a method of manufacturing the same.

A still further object of the present invention is to provide a plurality of semiconductor devices, such as a plurality of field effect transistors, on a single substrate, the plurality of devices including at least two that are complementary to each other, the plurality of devices having a decreased capacitance between the gate and drain while having a decreased source resistance, and a method of producing the same.

The foregoing objects are achieved by use of impurity-doped layers in electrical contact with a first semiconductor layer underlying a conducting member of the semiconductor device, wherein the impurity-doped layers in contact with the first semiconductor layer do not contact a barrier layer (second semiconductor layer) between the first semiconductor layer and the Conducting member.

The present invention is applicable, e.g., to a hetero-junction semiconductor device (e.g., a hetero-junction field effect transistor), having a hetero-junction formed between first and second semiconductor layers of different semiconductor material, and a gate electrode overlying the second semiconductor layer (the second semiconductor layer being between the first semiconductor layer and the gate electrode), the impurity-doped layers (third semiconductor layers) contacting the first semiconductor layer to provide electrical connection with decreased resistance thereto.

Where the semiconductor device is a hetero-junction field effect transistor with first and second semiconductor layers of different semiconductor material and forming a hetero-junction therebetween, and the third semiconductor layers are of n-type conductivity, the electron affinity of the second semiconductor layer should be smaller than that of the first semiconductor layer.

Where the semiconductor device is a hetero-junction field effect transistor with first and second semiconductor layers of different semiconductor material and forming a hetero-junction therebetween, and the third semiconductor layers are of p-type conductivity, a sum of the electron affinity and bandgap of the second semiconductor layer should be larger than such sum of the first semiconductor layer.

A semiconductor device according to the present invention will now be described by way of an example in which it is applied to an AlGaAs/GaAs hetero-junction FET. This example is illustrative of the present invention and is not limiting, the present invention being defined by the claims. FIG. 1 illustrates the structure of this example, in cross section.

In order to decrease Rs according to the present invention, an n-type GaAs contact layer 6 is selectively grown like in the above-mentioned prior art and is brought into direct contact with an n-type GaAs channel layer 3 without interposing an undoped AlGaAs barrier layer 4 therebetween. According to the present invention, furthermore, Cgd is decreased by employing a structure in which the contact layer 6 is not in contact with the side surfaces of the barrier layer 4, unlike the aforementioned prior art.

The foregoing objects are also achieved by a method wherein a barrier layer is provided between a gate electrode and a channel-forming layer of a semiconductor device, side surfaces of the channel-forming layer and the barrier layer are exposed, and impurity-doped layers are provided in contact with the side surfaces of the channel-forming layer and not in contact with side surfaces of the barrier layer. Desirably, the side surfaces of the barrier layer are masked during deposition of the impurity-doped layers, so as to avoid deposition of the impurity-doped layers on the side surfaces of the barrier layer.

Methods of fabricating the semiconductor device according to the present invention will now be described by way of examples, which are adapted to an AlGaAs/GaAs heterojunction FET. These examples are illustrative of the present invention and are not limiting. The steps of fabrication are shown in FIGS. 3(a)–3(d), wherein the length L of FIG. 1 is 0 μm.

A fabrication method according to the present invention employs a step of forming a surface oxide film 10 by oxidizing the side surfaces of the n-type GaAs channel layer 3 and side surfaces of the undoped AlGaAs barrier layer 4 that are exposed by etching, a step of selectively removing the surface oxide film 10 from the side surfaces of the channel layer 3 while leaving the surface oxide film formed on the side surfaces of the barrier layer 4, and a step of selectively growing the contact layer 6 on the regions inclusive of side surfaces of the channel layer 3 by using, as a mask, the surface oxide film 10 that is left on the side surfaces of the barrier layer Thus, the contact layer is formed so as not to be in contact with the side surfaces of the barrier layer 4.

In the step of forming the surface oxide film 10, the oxidation may be carried out either spontaneously by exposing the surfaces to the air or by processing with ozone. This surface oxide film is thin; illustratively, and not limiting, this surface oxide film has a thickness of 1 or 2 nm.

In the step of selectively removing the surface oxide film 10 from the side surfaces of the channel layer 3, this can be effected by heating at a suitable temperature in vacuum. In general, the temperature (cleaning temperature) at which the surface oxide film of the semiconductor layer is decomposed and removed by the heating in vacuum, varies depending upon the composition of the semiconductor layer. For instance, a surface oxide film of GaAs decomposes at about 580° C., whereas the surface oxide film of AlGaAs does not decompose below 650° C. when the Al composition of the AlGaAs is 0.1. Therefore, a heat treatment at 580°–650° C. is carried out in a vacuum to remove the surface oxide film 10 from the side surfaces of the GaAs channel layer 3 while leaving the surface oxide film 10 on the side surfaces of the AlGaAs barrier layer 4. This selective oxide removal can be monitored by known techniques, such as the RHEED method.

The MOMBE method can be employed in the step of selectively growing the contact layer 6 on the regions inclusive of side surfaces of the channel layer 3 by using, as a mask, the surface oxide film 10 that is left on the side surfaces of the barrier layer 4.

Operation of the structure of the present invention will now be described, with reference to FIG. 4.

A major component of capacitance Cgd between the gate and drain is so-called fringing capacitance. This is a capacitive component corresponding to a portion of the depletion layer 11 spreading beyond the gate, the depletion layer 11 being formed in the gate junction portion on the side of the semiconductor layer. In order to decrease Cgd, therefore, formation of the depletion layer should be suppressed in the region that is spreading beyond the gate.

Major portions of the FET structures of the present invention and of the prior art are shown in FIGS. 4(a) and 4(b), respectively. According to the prior art, the contact layer 6 is in contact with the side surface of the barrier layer 4, and the depletion layer 11 spreads up the side surface of the barrier layer 4. According to the present invention, on the other hand, the contact layer 6 is not in contact with the side surface of the barrier layer 4, and the depletion layer 11 does not spread toward the side surface of the barrier layer 4. Therefore, the depletion layer is suppressed from being formed in the regions extending beyond the gate, and Cgd can be decreased.

The value Cgd varies depending upon the length L in the drawing. FIG. 4(c) shows Cgd values of FETs according to the present invention and the prior art, and wherein the barrier layer 4 has a thickness t of 10 nm, from which it will be understood that the present invention makes it possible to decrease Cgd. It will be further understood that, according to the present invention, the effect of decreasing Cgd is especially conspicuous when the length L is not greater than 10 times the thickness t.

The structure of the present invention can be realized by the aforementioned fabrication method of the present invention.

DETAILED DESCRIPTION OF THE INVENTION

Figure 1:
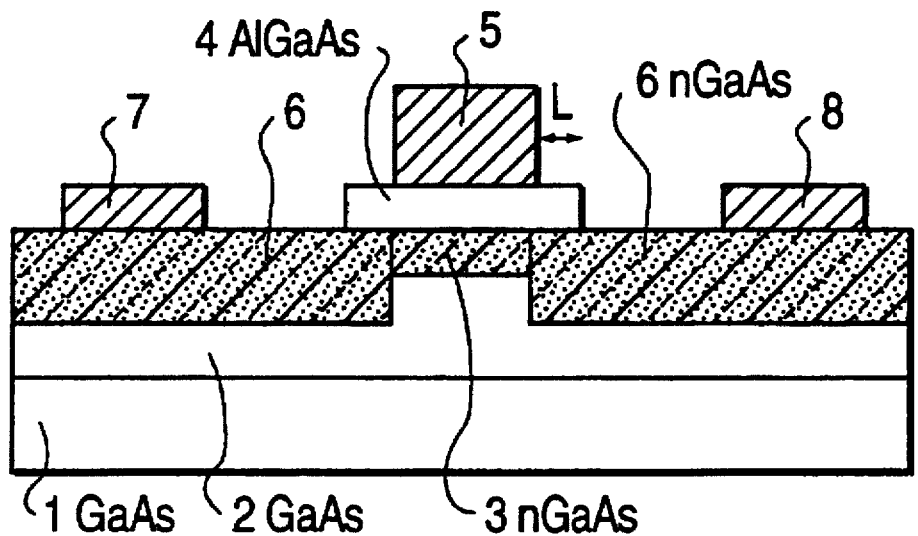
FIG. 1 is a sectional view of a field-effect transistor according to a first embodiment of the present invention.
Figure 2:
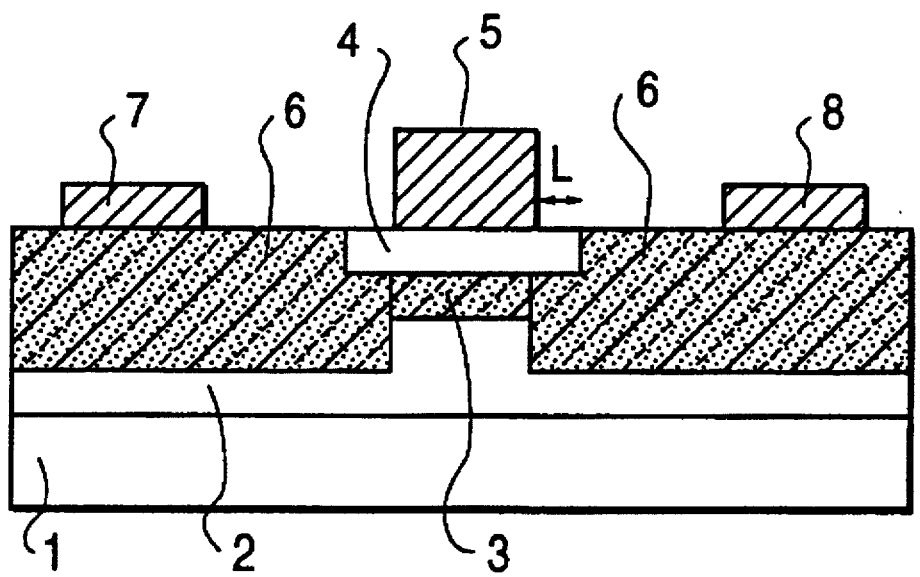
FIG. 2 is a sectional view of a conventional field-effect transistor.
Figure 3A:
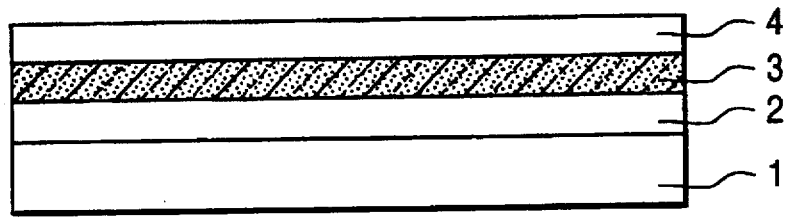
FIGS. 3(a)–3(d) are diagrams illustrating the steps of fabricating a field-effect transistor structure according to the present invention.
Figure 3B:
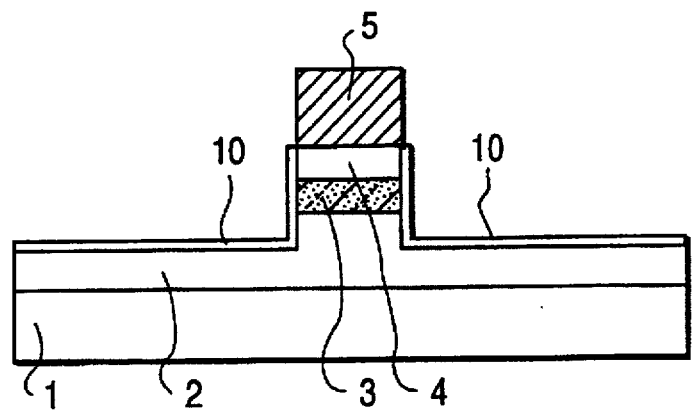
Figure 3C:
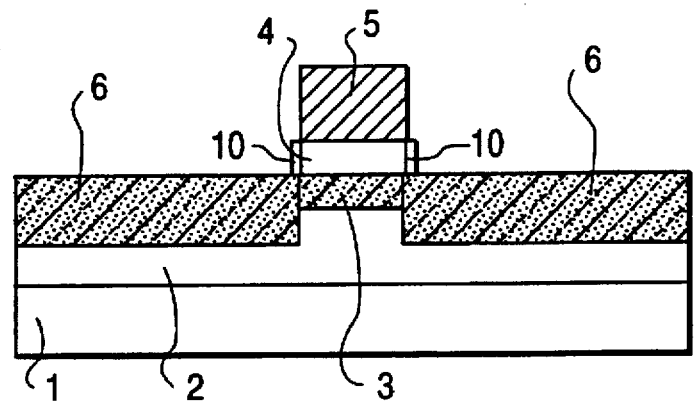
Figure 3D:
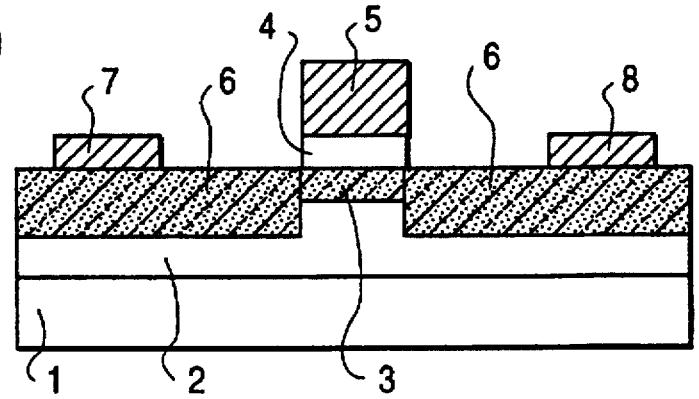
Figure 4A:
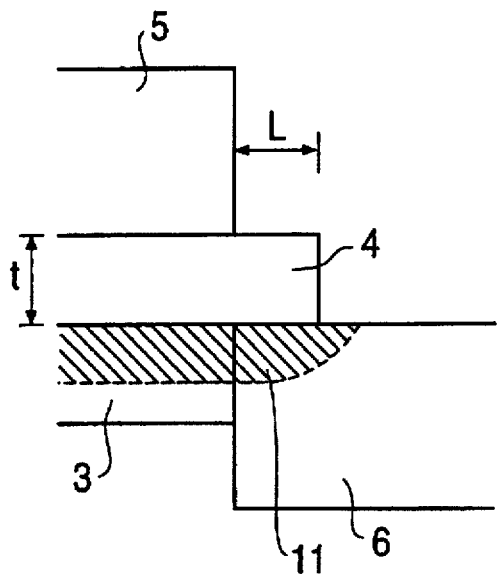
FIGS. 4(a)–4(c) are diagrams illustrating the effects of the field-effect transistor structure according to the present invention.
Figure 4B:
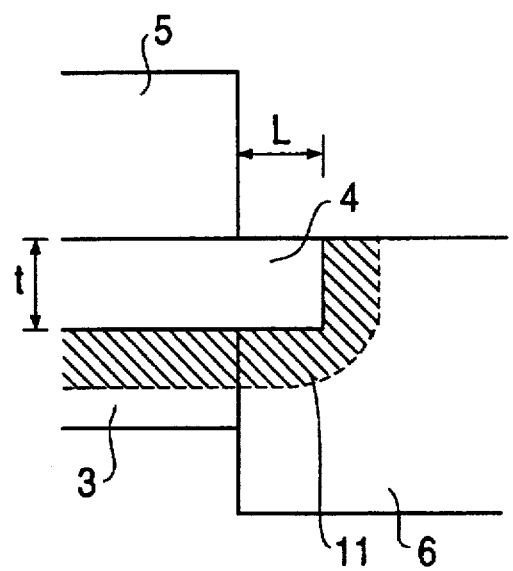
Figure 4C:
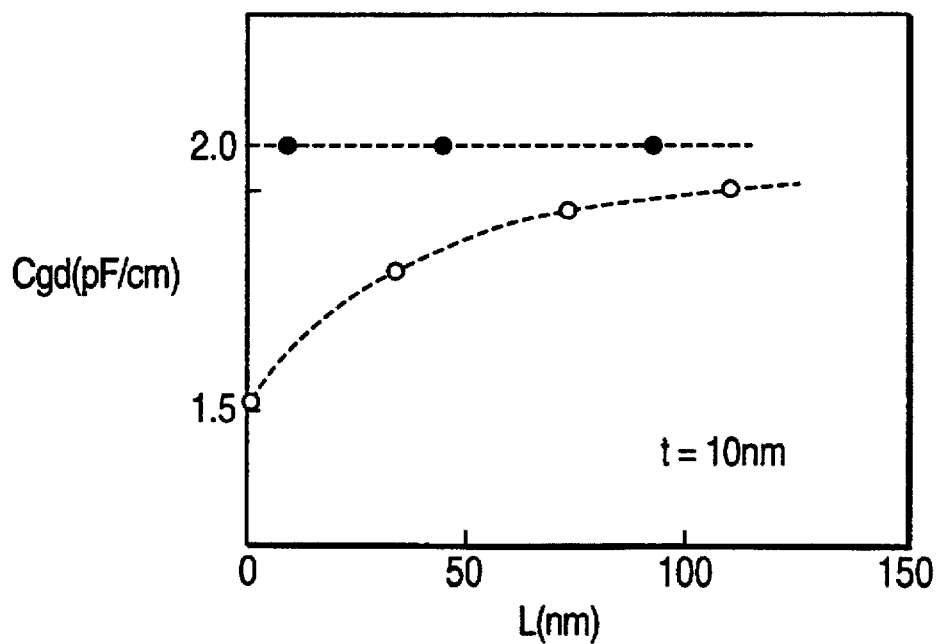

While the invention will be described in connection with specific and preferred embodiments, it will be understood that it is not intended to limit the invention to those embodiments. To the contrary, it is intended to cover all alterations, modifications and equivalents as may be included within the spirit and scope of the invention as defined by the appended claims.

The following embodiments further describe and demonstrate the present invention, and illustrate advantages of the present invention. The embodiments are given solely for the purpose of illustration and are not to be construed as limitations of the invention. Many variations thereof are possible without departing from the spirit and scope of the present invention.

EMBODIMENT 1

A first embodiment of the present invention will now be described with reference to FIG. 1. This embodiment is one in which the present invention is applied to an AlGaAs/GaAs hetero-junction FET. The device shown has GaAs channel-forming layer 3, n-type contact layers 6, source and drain electrodes 7 and 8, barrier layer 4 and gate electrode 5. The device shown is an n-type device.

The method of fabrication will now be described, in connection with FIGS. 3(a)–3(d).

On a semi-insulating GaAs substrate 1 are successively grown an undoped GaAs layer 2 (600 nm thickness), an n-type GaAs layer 3 (Si concentration of $5 \times 10^{18}/cm^3$, 10 nm thickness), and an undoped AlGaAs layer 4 (Al composition 0.3, 10 nm thickness), by the MBE method. See FIG. 3(a).

Next, a film of WSi/W laminated layers is deposited on the undoped AlGaAs layer 4, and is shaped into a desired pattern to form a gate electrode 5. See FIG. 3(b).

The undoped AlGaAs layer 4 is removed by etching except from beneath the gate electrode 5 by the ECR (electron cyclotron resonance) plasma etching method, using an $SiCl_4$ gas as the etching gas. Then, the n-type GaAs layer 3 and the undoped GaAs layer 2 are subjected to isotropic etching by the reactive ion etching method, using a mixture gas of $SF_6$ and $SiCl_4$ as the etching gas, to cut the lower side of the undoped AlGaAs 4.

Surfaces of the undoped GaAs layer 2, n-type GaAs layer 3 and undoped AlGaAs layer 4 which are exposed by etching are oxidized by treatment with ozone to form a surface oxide film. The treatment with ozone can be performed at room temperature. An illustrative room-temperature treatment with ozone includes irradiating the device, in air, with ultraviolet light, the irradiating causing the oxygen in the air to change to ozone, which causes oxidation of exposed surfaces of the layers 2–4. This is a standard oxidation technique.

The device is then heated at 600° C. in a MOMBE apparatus while being irradiated with As, in order to selectively remove the surface oxide film except from the surface of the undoped AlGaAs 4. The irradiation with As is, illustratively, at a beam equivalent pressure of $As_4$ of $1 \times 10^{-5}$ Torr. Irradiation with As is performed in order to compensate for volatilization (removal) of As from the As-containing layers during the heat treatment for selective oxide removal. Generally, the irradiation with As is with a sufficient amount of As, in view of the vapor pressure of As, to avoid loss of As from the As-containing layers.

Then, an n-type GaAs layer 6 (Si concentration of $5 \times 10^{18}/cm^3$) is selectively grown on the surfaces of the undoped GaAs layer 2 add the n-type GaAs layer 3 by the MOMBE method.

A source electrode 7 and a drain electrode 8, of a film of AuGe/Ni/Au laminated layers, are formed on the n-type GaAs layer 6 by the known lift-off method, and are treated at 400° C. to form alloys thereof.

The AlGaAs/GaAs hetero-junction FET fabricated through the above-mentioned steps exhibits good characteristics with Rs being 17 mΩ·cm and Cgd being 1.5 pF/cm.

EMBODIMENT 2

Figure 5:
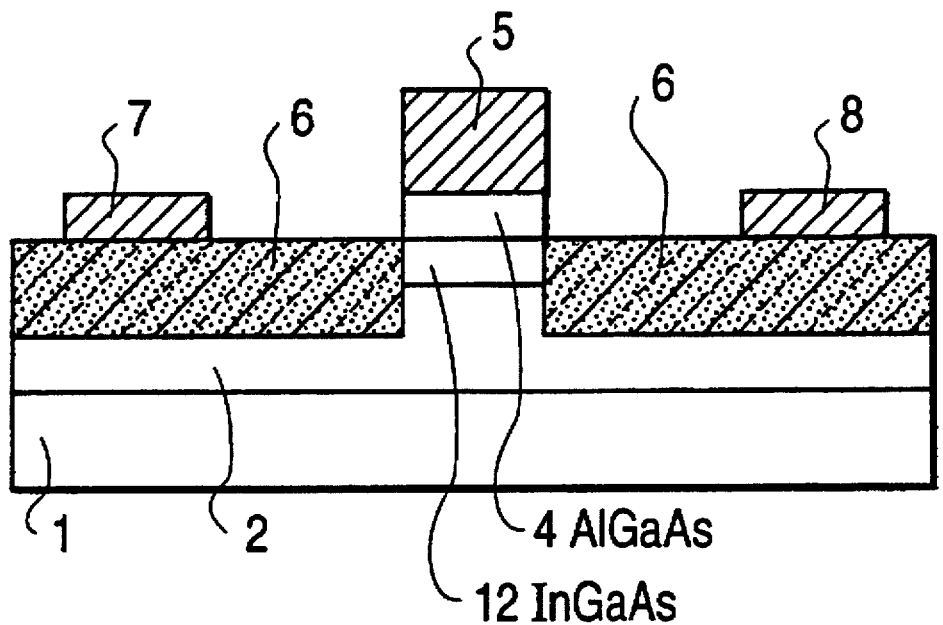
FIG. 5 is a sectional view of a field-effect transistor according to a second embodiment of the present invention.

A second embodiment of the present invention will now be described with reference to FIG. 5. This embodiment is one in which the present invention is applied to an AlGaAs/InGaAs hetero-junction FET. The semiconductor device is n-type and includes InGaAs channel-forming layer 12, n-type GaAs contact layers 6, AlGaAs barrier layer 4, gate electrode 5, and source and drain electrodes 7 and 8.

The method of fabrication will now be described.

On a semi-insulating GaAs substrate 1 are successively grown an undoped GaAs layer 2 (600 nm thickness), an undoped InGaAs layer 12 (In composition 0.2, 10 nm thickness), and an undoped AlGaAs layer 4 (Al composition 0.3, 10 nm thickness) by the MBE method.

Next, a film of WSi/W laminated layers is deposited on the undoped AlGaAs 4, and is shaped into a desired pattern to form a gate electrode 5.

Using the gate electrode 5 as a mask, the undoped AlGaAs layer 4, the undoped InGaAs layer 12, and the undoped GaAs layer 2 are etched to a total depth of 30 nm from the original surface thereof by the ECR plasma etching method, by using $SiCl_4$ gas as the etching gas, in order to remove portions of the undoped AlGaAs layer 4, undoped InGaAs layer 12 and undoped GaAs layer 2.

Surfaces of the undoped GaAs layer 2, undoped InGaAs layer 12 and undoped AlGaAs layer 4 which are exposed by etching are oxidized by the treatment with ozone to form a surface oxide film. The device is then heated at 600° C. in a MOMBE apparatus while being irradiated with As, in order to selectively remove the surface oxide film except from the surface of the undoped AlGaAs 4. Then, an n-type GaAs layer 6 (Si concentration of $5 \times 10^{18}/cm^3$) is selectively grown on the surfaces of the undoped GaAs layer 2 and the undoped InGaAs layer 12 by the MOMBE method.

A source electrode 7 and a drain electrode 8 of a film of AuGe/Ni/Au laminated layers are formed on the n-type GaAs layer 6 by the lift-off method and are treated at 400° C. to form alloys thereof.

The AlGaIs/GaAs hetero-junction FET fabricated through the above-mentioned steps exhibits good characteristics with Rs being 17 mΩ·cm and Cgd being 1.5 pF/cm.

EMBODIMENT 3

Figure 6:
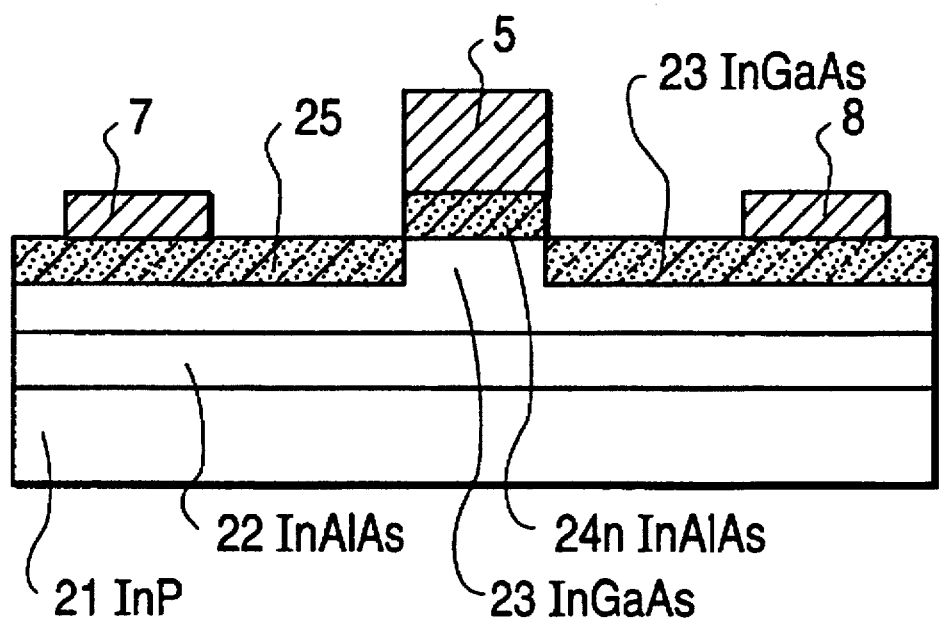
FIG. 6 is a sectional view of a field-effect transistor according to a third embodiment of the present invention.

A third embodiment of the present invention will now be described with reference to FIG. 6. This embodiment is one in which the present invention is applied to an InAlAs/InGaAs hetero-junction FET. The semiconductor device is n-type, and includes InGaAs channel-forming layer 23, n-type InAlAs layer 24, n-type InGaAs contact layers 25, gate electrode 5, and source and drain electrodes 7 and 8.

The method of fabrication will now be described.

On a semi-insulating InP substrate 21 are successively grown an undoped InAlAs layer 12 (In composition 0.5, 600 nm thickness), an undoped InGaAs layer 23 (In composition 0.5, 40 nm thickness), and an n-type InAlAs layer 24 (In composition 0.5, 10 nm thickness) by the MBE method.

Next, a film of WSi/W laminated layers is deposited on the n-type InAlAs layer 24, and is shaped into a desired pattern to form a gate electrode 5.

Using the gate electrode 5 as a mask, the n-type InAlAs layer 24 and the undoped InGaAs layer 23 are etched a total of 30 nm from the original surface thereof by the ECR plasma etching method by using $SiCl_4$ gas as the etching gas, in order to remove portions of the n-type InAlAs 24 and undoped InGaAs 23.

Surfaces of the undoped InGaAs 23 and n-type InAlAs 24 which are exposed by etching are oxidized by treatment with ozone to form a surface oxide film. The device is then heated at 600° C. in a MOMBE apparatus while being irradiated with As, in order to selectively remove the surface oxide film except from the surface of the n-type InAlAs 24. Then, an n-type InGaAs layer 25 (In composition 0.5, Si concentration of $1\times10^{19}/cm^3$) is selectively grown on the surface of the undoped InGaAs 23 by the MOMBE method.

A source electrode 7 and a drain electrode 8 of a film of AuGe/Ni/Au laminated layers are formed on the n-type InGaAs layer 25 by the lift-off method and are treated at 400° C. to form alloys thereof.

The InAlAs/InGaAs hetero-junction FET fabricated through the above-mentioned steps exhibits good characteristics with Rs being 17 mΩ·cm and Cgd being 1.5 pF/cm.

EMBODIMENT 4

Figure 7:
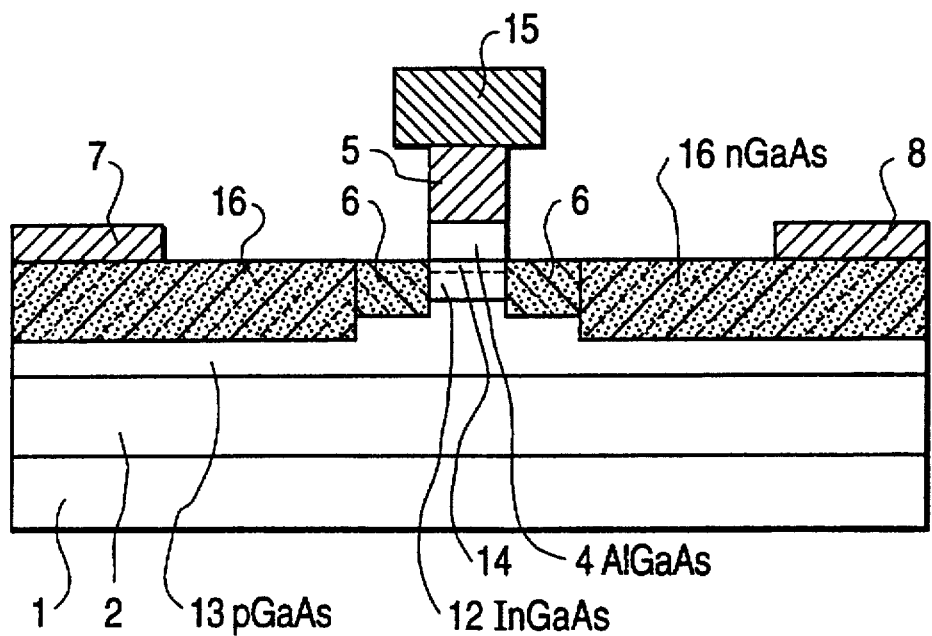
FIG. 7 is a sectional view of a field-effect transistor according to a fourth embodiment of the present invention.

A fourth embodiment of the present invention will now be described with reference to FIG. 7 and FIGS. 9(a)–9(d). This embodiment is one in which the present invention is applied to an AlGaAs/InGaAs hetero-junction FET. The semiconductor device is n-type, having InGaAs channel-forming layer 12, with Si delta-doped layer 14 therein, n-type GaAs contact layers 6 and further n-type GaAs contact layers 16, first gate electrode 5 and second gate electrode 15 thereon, and source and drain electrodes 7 and 8. The structure of FIG. 7 is especially designed for microwave device applications.

The method of fabrication will now be described, particularly with reference to FIGS. 9(a)–9(d).

On a semi-insulating GaAs substrate 1 are successively grown an undoped GaAs layer 2 (300 nm thickness), a p-type GaAs layer 13 (Be concentration of $3\times10^{16}/cm^3$, 300 nm thickness), and an undoped AlGaAs layer 4 (Al composition 0.3, 10 nm thickness) by the MBE method. See FIG. 9(a).

In the undoped InGaAs layer 12 is provided an Si delta-doped layer (Si sheet concentration of $5\times10^{12}/cm^2$) at a position of 3 nm from the surface side. The Si delta-doped layer is a known layer formed by a known technique, described in the article by Schubert, et al, "The δ-Doped Field-Effect Transistor", in *Japanese Journal of Applied Physics*, Vol. 24, No. 8 (August 1985), pages L608–L610, the contents of which are incorporated herein by reference in their entirety. The delta-doped layer acts for threshold voltage adjustment of the field-effect transistor, and is a known technique for threshold voltage adjustment. The Si delta-doped layer is a single-atom-thick layer within the InGaAs layer, and can be formed by molecular beam epitaxy (MBE). The layer 12, with the Si delta-doped layer, can be formed by the following procedure:

(1) Form an InGaAs film by MBE, then cut off the sources of In, Ga and As;

(2) Form an Si layer, of a single atom thickness, by MBE; and (3) Form the remainder of the InGaAs layer 12 by MBE.

Next, a film of WSi/W laminated layers is deposited on the undoped AlGaAs 4, and is shaped into a desired pattern to form a gate electrode 5. See FIG. 9(b).

Using the gate electrode 5 as a mask, the undoped AlGaAs layer 4, the undoped InGaAs layer 12, and the p-type GaAs layer 13 are etched a total of by 30 nm from the original surface thereof by the ECR plasma etching method using SiCl₄ gas as the etching gas, in order to remove portions of the undoped AlGaAs layer 4, undoped InGaAs layer 12 and p-type GaAs layer 13.

Surfaces of the p-type GaAs layer 13, undoped InGaAs layer 12 and undoped AlGaAs layer 4 which are exposed by etching are oxidized by treatment with ozone to form a surface oxide film. The device is then heated at 600° C. in a MOMBE apparatus while being irradiated with As, in order to selectively remove the surface oxide film except from the surface of the undoped AlGaAs 4. Then, an n-type GaAs layer 6 (Si concentration of $5\times10^{18}/cm^3$) is selectively grown on the surfaces of the p-type GaAs layer 13 and the undoped InGaAs layer 12 by the MOMBE method.

Next, an SiO₂ film is deposited on the whole surface of the wafer, by the known CVD method, and the SiO₂ film is subjected to anisotropic dry etching to form SiO₂ side walls on the side surfaces of the gate electrode 5 and the undoped AlGaAs layer 4. See FIG. 9(c).

Using the gate electrode 5 and the SiO₂ side walls as masks, the n-type GaAs layer 6 and the p-type GaAs layer 13 are etched a depth of 80 nm from the surface thereof by the ECR plasma etching method, using SiCl₄ gas as the etching gas, in order to remove portions of the n-type GaAs 6 and p-type GaAs 13. Then, an n-type GaAs layer 16 (Si concentration of $5\times10^{18}/cm^3$) is grown on the surfaces of the p-type GaAs 13 and the undoped InGaAs 12 by the MQMBE method. See FIG. 9(c).

A source electrode 7 and a drain electrode 8 of a film of AuGe/Ni/Au laminated layers are formed on the n-type GaAs layer 16 by the lift-off method and are treated at 400° C. to form alloys thereof.

Figure 9A:
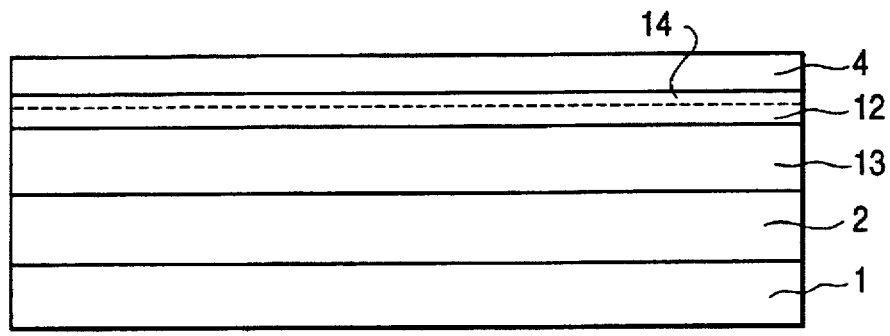
FIGS. 9(a)–9(d) are diagrams illustrating the steps of fabricating a field-effect transistor according to the fourth embodiment of the present invention.
Figure 9B:
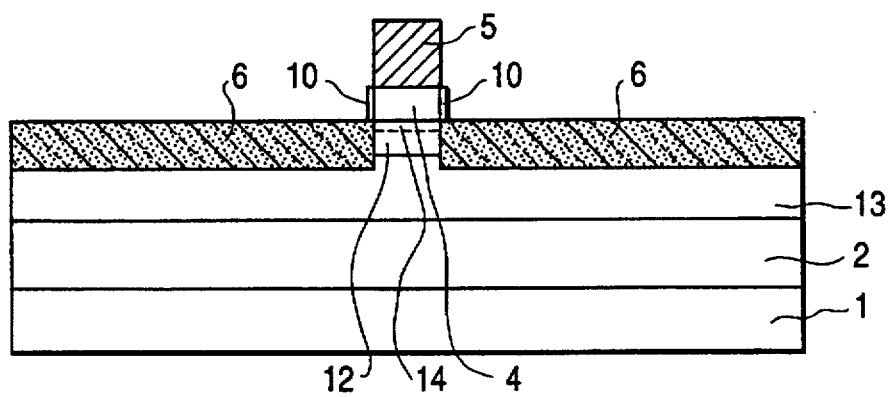
Figure 9C:
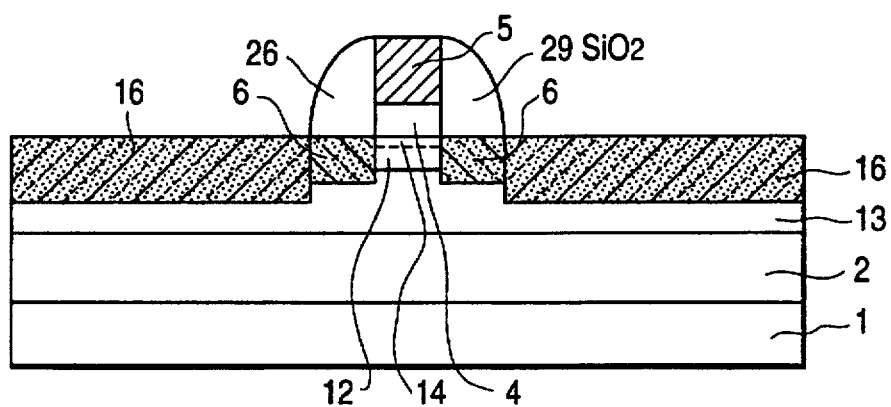
Figure 9D:
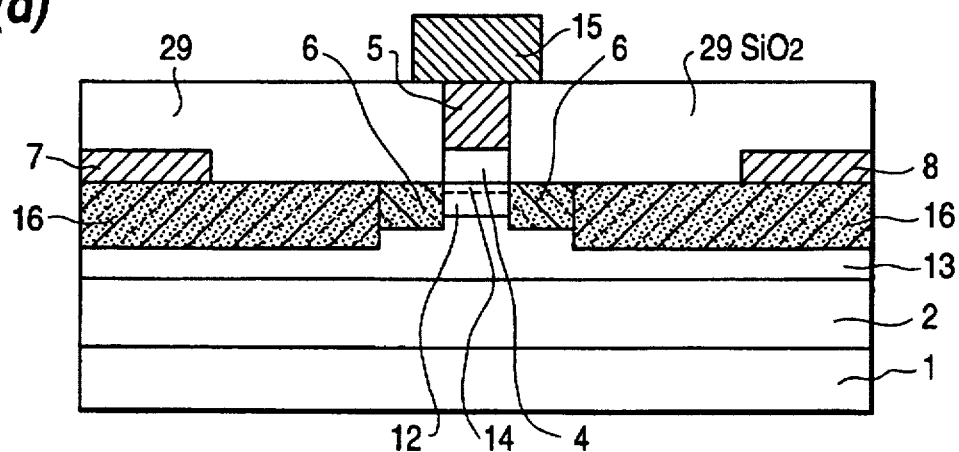

Next, as seen in FIG. 9(d), an SiO₂ film 29 is deposited on the whole surface of the wafer by the CVD method. After the whole surface is flattened by using a photoresist, the upper surface of the gate electrode 5 is exposed by dry etching-back which exhibits nearly the same etching rate for the photoresist and for the SiO₂. After the photoresist is removed, an Al film is deposited on the whole surface which is then patterned into a desired shape to form an Al layer 15 on the gate electrode 5. The Al layer 15 has a lower resistivity than the WSi/W laminate of gate electrode 5. The Al layer 15 is added to decrease gate resistance, which is particularly desirable for microwave devices.

The AlGaAs/GaAs hetero-junction FET fabricated through the above-mentioned steps exhibits good characteristics with Rs being 17 mΩ·cm and Cgd being 1.5 pF/cm.

EMBODIMENT 5

A fifth embodiment of the present invention will now be described with reference to FIG. 8 and FIGS. 10(a)–10(d). This embodiment is one in which the present invention is applied to an AlGaAs/InGaAs hetero-junction FET, and complementary AlGaAs/InGaAs hetero-junction FETs are provided on a single substrate. The device has, on a single substrate, (1) a first, n-type semiconductor device having InGAs channel-forming layer 12, AlGaAs barrier layer 4, n-type GaAs contact layers 6, gate electrode 5 and source and drain electrodes 7 and 8; and (2) a second, p-type semiconductor device having InGaAs channel-forming layer 12, AlGaAs barrier layer 4, p-type GaAs contact layers 17, gate electrode 5 and source and drain electrodes 27 and 28.

The method of fabrication will now be described.

On a semi-insulating GaAs substrate 1 are successively grown an undoped GaAs layer 2 (600 nm thickness), an undoped InGaAs layer 12 (In composition 0.2, 10 nm thickness), and an undoped AlGaAs layer 4 (Al composition 0.7, 10 nm thickness) by the MBE method. See FIG. 10(a). m Next, a film of WSi/W laminated layers is deposited on the undoped AlGaAs layer 4, and is shaped into a desired pattern to form gate electrodes 5. See FIG. 10(b).

An SiO$_2$ mask layer 18 is formed using a conventional resist process. Then, using the gate electrode 5 and the SiO$_2$ layer 18 as a mask (see FIG. 10(b)), the undoped AlGaAs layer 4, the undoped InGaAs layer 12, and the undoped GaAs layer 2 are etched a total depth of 30 nm from the original surface thereof by the ECR plasma etching method, using SiCl$_4$ gas as the etching gas, in order to remove portions of the undoped AlGaAs layer 4, undoped InGaAs layer 12 and undoped GaAs layer 2.

Surfaces of the undoped GaAs layer 2, undoped InGaAs layer 12 and undoped AlGaAs layer 4 which are exposed by the aforementioned etching are oxidized by treatment with ozone to form a surface oxide film. The device is then heated at 600° C. in a MOMBE apparatus while being irradiated with As, in order to selectively remove the surface oxide film except from the surface of the undoped AlGaAs layer 4. An n-type GaAs layer 6 (Si concentration of 5×10$^{18}$ cm$^{-3}$) is selectively grown on the surface of the undoped GaAs layer 2 and undoped InGaAs layer 12 by the MOMBE method. See FIG. 10(b). Then, the SiO$_2$ mask layer 18 is removed.

Figure 10A:
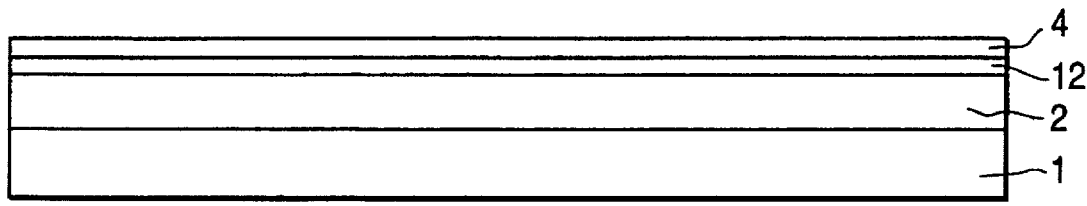
FIGS. 10(a)–10(d) are diagrams illustrating the steps of fabricating a field-effect transistor according to the fifth embodiment of the present invention.
Figure 10B:
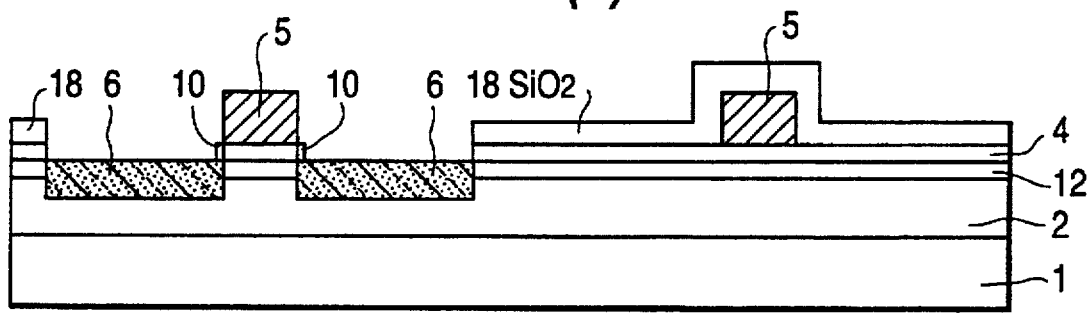
Figure 10C:
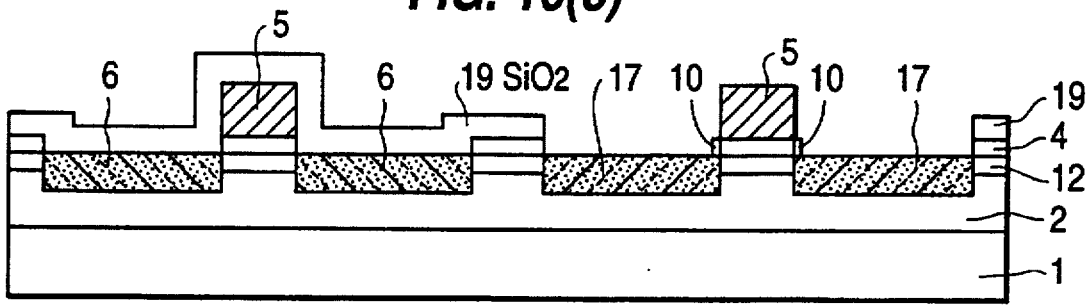

As shown in FIG. 10(c), an SiO$_2$ mask layer 19 is formed using a conventional resist process. Then, using the gate electrode 5 and the SiO$_2$ layer 19 as a mask, the undoped AlGaAs layer 4, the undoped InGaAs layer 12, and the undoped GaAs layer 2 are etched a total depth of 30 nm from the original surface thereof by the ECR plasma etching method, using SiCl$_4$ gas as the etching gas, in order to remove portions of the undoped AlGaAs layer 4, undoped InGaAs layer 12 and undoped GaAs layer 2.

Surfaces of the undoped GaAs layer 2, undoped InGaAs layer 12 and undoped AlGaAs layer 4, which are exposed by etching, are oxidized by treatment with ozone to form a surface oxide film. The device is then heated at 600° C. in a MOMBE apparatus, while being irradiated with As, in order to selectively remove the surface oxide film except from the surface of the undoped AlGaAs layer 4. A p-type GaAs layer 17 (carbon concentration of 5×10$^{19}$ cm$^{-3}$) is selectively grown on the surface of the undoped GaAs layer 2 and undoped InGaAs layer 12 by the MOMBE method. Note FIG. 10(c). Then, the SiO$_2$ mask layer 19 is removed.

Figure 10D:
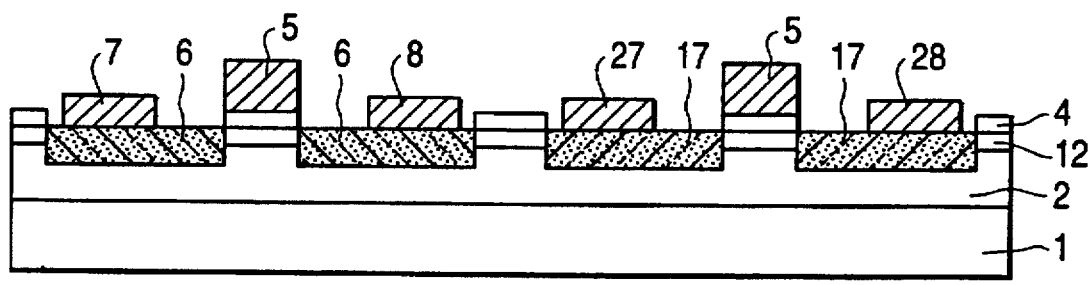

As seen in FIG. 10(d), a source electrode 7 and a drain electrode 8 of a film of AuGe/Ni/Au laminated layers are formed on the n-type GaAs layer 6 by the known lift-off method and are treated at 400° C. to form alloys thereof. A source electrode 27 and a drain electrode 28 of a film of AuZn/Au laminated layers are formed on the p-type GaAs layer 17 by the known liftoff method, and are treated at 400° C. to form alloys thereof.

Figure 8:
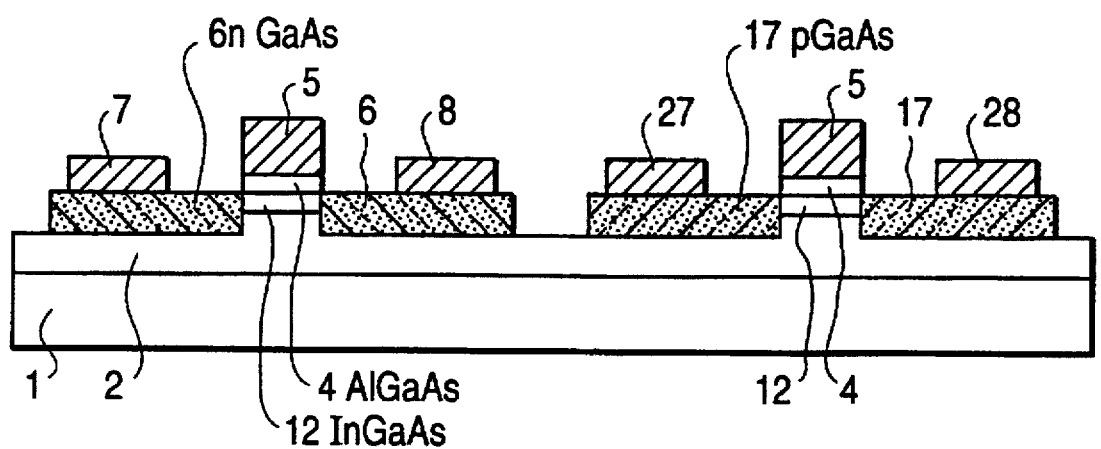
FIG. 8 is a sectional view of a field-effect transistor according to a fifth embodiment of the present invention.

The AlGaAs/InGaAs hetero-junction FET fabricated through the above-mentioned steps exhibits good characteristics with Rs being 17 mΩ-cm and Cgd being 1.5 pF/cm. The structure of FIG. 8 provides an integrated circuit with complementary devices. Illustratively, the pair of complementary devices shown in FIG. 8 are used in an integrated circuit as CMOS devices are customarily used.

While the above-discussed embodiments describe semiconductor devices having hetero-junctions formed between layers containing different elements, the present invention is not limited thereto; for example, the hetero-junctions can be formed between layers containing the same elements, but in different amounts, e.g., In$_{0.2}$Ga$_{0.8}$As and In0.1Ga$_{0.9}$As, respectively, as layers 3 and 4 in FIG. 1. Thus, the hetero-junction between, e.g., layers 3 and 4 in FIG. 1, of different materials, can be a hetero-junction between layers not containing the same elements, or can be a hetero-junction between layers containing the same elements but in different amounts.

While, in Embodiment 1, the contact layer 6 is made of the same material as the channel-forming layer 3 (the first semiconductor layer), the contact layer need not be made of the same material as that of the Channel-forming layer (i.e., the contact layer can be made of a different material than that of the channel-forming layer), as long as it provides a low-resistance contact.

Moreover, in Embodiment 1, the first semiconductor layer (layer 3) is doped to be n-type, while the second semiconductor layer (layer 4) is undoped. However, the present invention is not restricted to such specific conductivity types and/or doping levels for the first and second layers. For example, where the first semiconductor layer is doped to be n-type, the second layer can be either n-type or undoped. Moreover, when the second semiconductor layer is doped n-type, the first semiconductor layer can be doped n-type or can be undoped. Moreover, both the first and second semiconductor layers can be undoped.

Furthermore, where the first semiconductor layer is doped p-type, the second semiconductor layer can be either undoped or doped p-type. Moreover, where the second semiconductor layer is doped p-type, the first semiconductor layer can be either undoped or doped p-type.

Illustratively, where the first and/or second semiconductor layer is doped to be n-type, the impurity concentration thereof can be 1×10$^{19}$ cm$^{-3}$ or less, depending on the material (e.g., GaAs). Where the first and/or second semiconductor layer is doped p-type, the impurity concentration thereof is, illustratively, 1×10$^{20}$ cm$^{-3}$ or less, depending on the material.

Moreover, while in the embodiment of FIG. 1 the gate electrode is provided directly on the AlGaAs layer (second semiconductor layer), the gate electrode need not be directly on the second semiconductor layer. For example, in the embodiment of FIG. 1 a GaAs layer can be provided between the AlGaAs layer and the gate electrode.

According to the present invention which employs the structure in which the contact layer does not come in contact with the side surfaces of the barrier layer, the parasitic capacitance can be decreased, making it possible to realize a hetero-junction field-effect transistor of high performance.

While we have shown and described several embodiments in accordance with the present invention, it is understood that the same is not limited thereto, but is susceptible to numerous changes and modifications as known to one having ordinary skill in the art, and we therefore do not wish to be limited to the details shown and described herein, but intend to cover all such modifications as are encompassed by the scope of the appended claims.

We claim:

1. A contact, for a semiconductor device, comprising a first semiconductor layer, a second semiconductor layer provided on the first semiconductor layer so as to form a junction therebetween, the second semiconductor layer having a lower surface adjacent the first semiconductor later and side surfaces extending from the lower surface in a direction away from the first semiconductor layer, and impurity-doped third semiconductor layers positioned such that the first semiconductor layer is between the third semiconductor layers, the third semiconductor layers being selectively grown and being formed of different layers than that of said first semiconductor layer, the third semiconductor layers being in electrical contact with the first semiconductor layer and physically contacting opposed sides of the first semiconductor layer, said third semiconductor layers physically contacting the second semiconductor layer without physically contacting the side surfaces of the second semiconductor layer.

2. A contact according to claim 1, further comprising an electrically conducting member overlying the second semiconductor layer such that the second semiconductor layer is between the conducting member and the first semiconductor member.

3. A contact according to claim 1, wherein the first and second semiconductor layers are made of different semiconductor materials, a hetero-junction being formed between the first and second semiconductor layers.

4. A contact according to claim 3, wherein the first and second semiconductor layers are each made of III–V semiconductor material.

5. A semiconductor device comprising the contact of claim 1, the semiconductor device including the first and second semiconductor layers.

6. A contact according to claim 1, wherein said third semiconductor layers physically contact the lower surface of the second semiconductor layer but do not physically contact the side surfaces of the second semiconductor layer.

7. A contact according to claim 1, wherein the second semiconductor layer has corners formed by the side surfaces and the lower surface, at a location where the side surfaces begin to extend away from the lower surface, and wherein said third semiconductor layers physically contact said corners but do not physically contact the side surfaces of the second semiconductor layer.

8. A semiconductor device comprising at least one field-effect transistor having a first semiconductor layer, a second semiconductor layer provided on the first semiconductor layer and being of a different semiconductor material than that of the first semiconductor layer so as to form a hetero-junction between the first and second semiconductor layers, the second semiconductor layer having a lower surface adjacent the first semiconductor layer and side surfaces extending from the lower surface, in a direction away from the first semiconductor layer, a gate electrode overlying the second semiconductor layer, a channel being formed in the first semiconductor layer under the gate electrode, third semiconductor layers at opposed sides of the first semiconductor layer, the third semiconductor layers being selectively grown and being formed of different layers than that of said first semiconductor layer, the third semiconductor layers being impurity-doped, and source and drain electrodes respectively in contact with the third semiconductor layers, wherein the third semiconductor layers are in physical contact with the opposed sides of the first semiconductor layer, the third semiconductor layers physically contacting the second semiconductor layer without physically contacting the side surfaces of the second semiconductor layer.

9. A semiconductor device according to claim 8, wherein each of the first, second and third semiconductor layers is made of III–V semiconductor material.

10. A semiconductor device according to claim 8, wherein the first and third semiconductor layers are made of a same semiconductor material, different from the semiconductor material of the second semiconductor layer.

11. A semiconductor device according to claim 10, wherein the first and third semiconductor layers are made of GaAs, and the second semiconductor layer is made of AlGaAs.

12. A semiconductor device according to claim 10, wherein the first and third semiconductor layers are made of InGaAs, and the second semiconductor layer is made of AlGaAs.

13. A semiconductor device according to claim 10, wherein the first and third semiconductor layers are made of InGaAs, and the second semiconductor layer is made of InAlAs.

14. A semiconductor device according to claim 8, wherein the gate electrode includes a first gate electrode member overlying the second semiconductor layer and a second gate electrode member in electrical contact with and overlying the first gate electrode member, the second gate electrode member being made of a material having lower resistivity than material of the first gate electrode member.

15. A semiconductor device according to claim 14, wherein the material of the second gate electrode member is aluminum, and the material of the first gate electrode member is a WSi/W laminate.

16. A semiconductor device according to claim 8, wherein the device has at least two of the field-effect transistors, on a single substrate, one of the at least two field-effect transistors having third semiconductor layers that are doped with an n-type impurity so as to form n-type third semiconductor layers, and another of the at least two field-effect transistors having third semiconductor layers that are doped with p-type impurity so as to form p-type third semiconductor layers, said one and said another of the at least two field-effect transistors providing complementary transistors on the single substrate.

17. A semiconductor device according to claim 8, wherein the first semiconductor layer, in which the channel is formed, has a delta-doped layer therein.

18. A semiconductor device according to claim 17, wherein the delta-doped layer is a silicon delta-doped layer.

19. A semiconductor device according to claim 8, wherein said second semiconductor layer is a barrier layer.

20. A semiconductor device according to claim 8, wherein a length of the gate electrode is substantially the same as a length between the third semiconductor layers in contact with the opposed sides of the first semiconductor layer.

21. A semiconductor device according to claim 8, wherein said third semiconductor layers physically contact the lower surface of the second semiconductor layer but do not physically contact the side surfaces of the second semiconductor layer.

22. A semiconductor device according to claim 8, wherein the second semiconductor layer has corners formed by the side surfaces and the lower surface, at a location where the side surfaces begin to extend away from the lower surface, and wherein said third semiconductor layers physically contact said corners but do not physically contact the side surfaces of the second semiconductor layer.

23. A semiconductor device comprising a field-effect transistor having a first semiconductor layer, a second semiconductor layer provided on the first semiconductor layer and having an electron affinity which is smaller than that of the first semiconductor layer, the second semiconductor layer having a lower surface adjacent the first semiconductor layer and side surfaces extending from the lower surface, in a direction away from the first semiconductor layer, and a gate electrode formed on the second semiconductor layer, wherein the first semiconductor layer is arranged between third semiconductor layers to which n-type impurities have been added, the third semiconductor layers being selectively grown and being formed of different layers than that of said first semiconductor layer, and the third semiconductor layers are connected to source and drain electrodes, the third semiconductor layers being in physical contact with side surfaces of the first semiconductor layer, the third semiconductor layers physically contacting the second semiconductor layer without physically contacting the side surfaces of the second semiconductor layer.

24. A semiconductor device according to claim 23, wherein the first semiconductor layer is GaAs, the second semiconductor layer is AlGaAs, and the third semiconductor layers are GaAs.

25. A semiconductor device according to claim 23, wherein the first semiconductor layer is InGaAs, the second semiconductor layer is AlGaAs, and the third semiconductor layers are InGaAs.

26. A semiconductor device according to claim 23, wherein the first semiconductor layer is InGaAs, the second semiconductor layer is InAlAs, and the third semiconductor layers are InGaAs.

27. A semiconductor device according to claim 23, wherein the first semiconductor layer is of n-type conductivity.

28. A semiconductor device according to claim 27, wherein the second semiconductor layer is of n-type conductivity.

29. A semiconductor device according to claim 27, wherein the second semiconductor layer is undoped.

30. A semiconductor device according to claim 23, wherein the second semiconductor layer contains n-type impurities.

31. A semiconductor device according to claim 30, wherein the first semiconductor layer is substantially undoped.

32. A semiconductor device according to claim 23, wherein both the first and second semiconductor layers are substantially undoped.

33. A semiconductor device according to claim 23, wherein a length of the gate electrode is substantially the same as a length between the third semiconductor layers in contact with the opposed sides of the first semiconductor layer.

34. A semiconductor device according to claim 23, wherein said third semiconductor layers physically contact the lower surface of the second semiconductor layer but do not physically contact the side surfaces of the second semiconductor layer.

35. A semiconductor device according to claim 23, wherein the second semiconductor layer has corners formed by the side surfaces and the lower surface, at a location where the side surfaces begin to extend away from the lower surface, and wherein said third semiconductor layers physically contact said corners but do not physically contact the side surfaces of the second semiconductor layer.

36. A semiconductor device comprising a field-effect transistor having a first semiconductor layer, a second semiconductor layer provided on the first semiconductor layer, the second semiconductor layer having a lower surface adjacent the first semiconductor layer and side surfaces extending from the lower surface, in a direction away from the first semiconductor layer, each of the first and second semiconductor layers having a sum of an electron affinity and a band gap, the sum being larger for the second semiconductor layer than for the first semiconductor layer, and a gate electrode formed on the second semiconductor layer, wherein the first semiconductor layer is arranged between third semiconductor layers to which p-type impurities have been added, the third semiconductor layers being selectively grown and being formed of different layers than that of said first semiconductor layer, and the third semiconductor layers are connected to source and drain electrodes, the third semiconductor layers being in physical contact with side surfaces of the first semiconductor layer, the third semiconductor layers physically contacting the second semiconductor layer without physically contacting the side surfaces of the second semiconductor layer.

37. A semiconductor device according to claim 36, wherein the first semiconductor layer is GaAs, the second semiconductor layer is AlGaAs, and the third semiconductor layers are GaAs.

38. A semiconductor device according to claim 36, wherein the first semiconductor layer is InGaAs, the second semiconductor layer is AlGaAs, and the third semiconductor layers are InGaAs.

39. A semiconductor device according to claim 36, wherein the first semiconductor layer is InGaAs, the second semiconductor layer is InAlAs, and the third semiconductor layers are InGaAs.

40. A semiconductor device according to claim 36, wherein the first semiconductor layer is of p-type conductivity.

41. A semiconductor device according to claim 40, wherein the second semiconductor layer is of p-type conductivity.

42. A semiconductor device according to claim 40, wherein the second semiconductor layer is substantially undoped.

43. A semiconductor device according to claim 36, wherein the second semiconductor layer contains p-type impurities.

44. A semiconductor device according to claim 43, wherein the first semiconductor layer is substantially undoped.

45. A semiconductor device according to claim 36, wherein both the first and second semiconductor layers are substantially undoped.

46. A semiconductor device according to claim 36, wherein a length of the gate electrode is substantially the same as a length between the third semiconductor layers in contact with the opposed sides of the first semiconductor layer.

47. A semiconductor device according to claim 36, wherein said third semiconductor layers physically contact the lower surface of the second semiconductor layer but do not physically contact the side surfaces of the second semiconductor layer.

48. A semiconductor device according to claim 36, wherein the second semiconductor layer has corners formed by the side surfaces and the lower surface, at a location where the side surfaces begin to extend away from the lower surface, and wherein said third semiconductor layers physically contact said corners but do not physically contact the side surfaces of the second semiconductor layer.

* * * * *